(12) United States Patent
Herchen et al.

(10) Patent No.: US 7,285,195 B2
(45) Date of Patent: Oct. 23, 2007

(54) ELECTRIC FIELD REDUCING THRUST PLATE

(75) Inventors: Harald Herchen, Los Altos, CA (US); Dmitry Lubomirsky, Cupertino, CA (US); Bo Zheng, Saratoga, CA (US); Lily L. Pang, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 603 days.

(21) Appl. No.: 10/877,137

(22) Filed: Jun. 24, 2004

(65) Prior Publication Data

US 2005/0284754 A1 Dec. 29, 2005

(51) Int. Cl.
C25D 17/00 (2006.01)
C25D 5/00 (2006.01)
C25D 17/10 (2006.01)

(52) U.S. Cl. .............. 204/297.01; 204/224 R; 204/286.1; 204/287; 205/96

(58) Field of Classification Search ........... 204/297.01, 204/286.1, 224 R, 287; 205/96
See application file for complete search history.

(56) References Cited

U.S. PATENT DOCUMENTS

| | | | |
|---|---|---|---|
| 3,649,509 A | 3/1972 | Morawetz et al. | |
| 3,727,620 A | 4/1973 | Orr | |
| 3,770,598 A | 11/1973 | Creutz | |
| 4,027,686 A | 6/1977 | Shortes et al. | |
| 4,092,176 A | 5/1978 | Kozai et al. | |
| 4,110,176 A | 8/1978 | Creutz et al. | |
| 4,113,492 A | 9/1978 | Sato et al. | |
| 4,304,641 A | 12/1981 | Grandia et al. | |
| 4,315,059 A | 2/1982 | Raistrick et al. | |
| 4,326,940 A | 4/1982 | Eckles et al. | |
| 4,336,114 A | 6/1982 | Mayer et al. | |
| 4,376,685 A | 3/1983 | Watson | |
| 4,405,416 A | 9/1983 | Raistrick et al. | |

(Continued)

FOREIGN PATENT DOCUMENTS

DE 198 03 490 10/1998

(Continued)

OTHER PUBLICATIONS

International Search Report dated Nov. 15, 2002, for PCT/US 02/21432.

(Continued)

*Primary Examiner*—Roy V. King
*Assistant Examiner*—Nicholas A. Smith
(74) *Attorney, Agent, or Firm*—Patterson & Sheridan, LLP (57) ABSTRACT

A method and apparatus for an electrochemical processing cell that is configured to minimize bevel and backside deposition. The apparatus includes a contact ring assembly for supporting a substrate, a thrust plate movably positioned to engage a substrate positioned on the contact pins, and a lip seal member positioned to contact the thrust plate and the contact ring to prevent fluid flow therebetween. The lip seal includes at least one bubble release channel formed therethrough. The method includes positioning an electric field barrier between a backside substrate engaging member and a frontside substrate supporting member to prevent electric field from traveling to the bevel and backside of the substrate. The electric field barrier including at least one bubble release channel formed therethrough.

20 Claims, 10 Drawing Sheets

U.S. PATENT DOCUMENTS

| | | | |
|---|---|---|---|
| 4,428,815 A | 1/1984 | Powell et al. | |
| 4,435,266 A | 3/1984 | Johnston | |
| 4,489,740 A | 12/1984 | Rattan et al. | |
| 4,510,176 A | 4/1985 | Cuthbert et al. | |
| 4,518,678 A | 5/1985 | Allen | |
| 4,519,846 A | 5/1985 | Aigo | |
| 4,693,805 A | 9/1987 | Quazi | |
| 4,696,729 A | 9/1987 | Santini | |
| 4,732,785 A | 3/1988 | Brewer | |
| 4,789,445 A | 12/1988 | Goffman et al. | |
| 4,948,486 A | 8/1990 | Hosten | |
| 5,039,381 A | 8/1991 | Mullarkey | |
| 5,055,425 A | 10/1991 | Leibovitz et al. | |
| 5,092,975 A | 3/1992 | Yamamura et al. | |
| 5,155,336 A | 10/1992 | Gronet et al. | |
| 5,162,260 A | 11/1992 | Leibovitz et al. | |
| 5,222,310 A | 6/1993 | Thompson et al. | |
| 5,224,504 A | 7/1993 | Thompson et al. | |
| 5,227,041 A | 7/1993 | Brogden et al. | |
| 5,230,743 A | 7/1993 | Thompson et al. | |
| 5,252,807 A | 10/1993 | Chizinsky | |
| 5,256,274 A | 10/1993 | Poris | |
| 5,259,407 A | 11/1993 | Tuchida et al. | |
| 5,281,325 A | 1/1994 | Berg | |
| 5,290,361 A | 3/1994 | Hayashida et al. | |
| 5,292,137 A | 3/1994 | Simmons et al. | |
| 5,316,974 A | 5/1994 | Crank | |
| 5,328,589 A | 7/1994 | Martin | |
| 5,349,978 A | 9/1994 | Sago et al. | |
| 5,356,158 A | 10/1994 | Simmons et al. | |
| 5,377,708 A | 1/1995 | Bergman et al. | |
| 5,405,518 A | 4/1995 | Hsieh et al. | |
| 5,429,733 A | 7/1995 | Ishida | |
| 5,447,615 A | 9/1995 | Ishida | |
| 5,516,412 A | 5/1996 | Andricacos et al. | |
| 5,522,975 A | 6/1996 | Andricacos et al. | |
| 5,608,943 A | 3/1997 | Konishi et al. | |
| 5,625,170 A | 4/1997 | Poris | |
| 5,651,865 A | 7/1997 | Sellers | |
| 5,705,223 A | 1/1998 | Bunkofske | |
| 5,718,813 A | 2/1998 | Drummond et al. | |
| 5,723,028 A | 3/1998 | Poris | |
| 5,731,678 A | 3/1998 | Zila et al. | |
| 5,744,019 A | 4/1998 | Ang | |
| 5,785,826 A | 7/1998 | Greenspan | |
| 5,853,559 A | 12/1998 | Tamaki et al. | |
| 5,980,706 A | 11/1999 | Bleck et al. | |
| 5,985,126 A | 11/1999 | Bleck et al. | |
| 6,001,234 A | 12/1999 | Batz, Jr. et al. | |
| 6,004,440 A | 12/1999 | Hanson et al. | |
| 6,004,828 A | 12/1999 | Hanson | |
| 6,071,388 A | 6/2000 | Uzoh | |
| 6,080,289 A | 6/2000 | Palmatier et al. | |
| 6,080,291 A | 6/2000 | Woodruff et al. | |
| 6,090,711 A | 7/2000 | Batz, Jr. et al. | |
| 6,103,085 A | 8/2000 | Woo et al. | |
| 6,103,628 A | 8/2000 | Talieh | |
| 6,139,703 A | 10/2000 | Hanson et al. | |
| 6,139,712 A | 10/2000 | Patton et al. | |
| 6,156,167 A | 12/2000 | Patton et al. | |
| 6,159,354 A | 12/2000 | Contolini et al. | |
| 6,176,992 B1 | 1/2001 | Talieh | |
| 6,193,859 B1 | 2/2001 | Contolini et al. | |
| 6,207,572 B1 | 3/2001 | Talieh et al. | |
| 6,228,233 B1 | 5/2001 | Lakshmikanthan et al. | |
| 6,248,222 B1 | 6/2001 | Wang | |
| 6,251,050 B1 | 6/2001 | Keigler | |
| 6,251,235 B1 | 6/2001 | Talieh et al. | |
| 6,251,236 B1 | 6/2001 | Stevens | |
| 6,261,433 B1 | 7/2001 | Landau | |
| 6,270,647 B1 | 8/2001 | Graham et al. | |
| 6,271,433 B1 | 8/2001 | Keady et al. | |
| 6,274,010 B1 | 8/2001 | Henington et al. | |
| 6,274,013 B1 | 8/2001 | Bleck et al. | |
| 6,309,524 B1 | 10/2001 | Woodruff et al. | |
| 6,322,678 B1 | 11/2001 | Woodruff et al. | |
| 6,328,872 B1 | 12/2001 | Talieh et al. | |
| 6,343,793 B1 | 2/2002 | Patton et al. | |
| 6,352,623 B1 | 3/2002 | Volodarsky et al. | |
| 6,355,153 B1 | 3/2002 | Uzoh et al. | |
| 6,358,388 B1 | 3/2002 | Bleck et al. | |
| 6,391,116 B2 | 5/2002 | Moriyama | |
| 6,391,166 B1 | 5/2002 | Wang | |
| 6,402,925 B2 | 6/2002 | Talieh | |
| 6,409,904 B1 | 6/2002 | Uzoh et al. | |
| 6,413,388 B1 | 7/2002 | Uzoh et al. | |
| 6,413,403 B1 | 7/2002 | Lindquist et al. | |
| 6,423,636 B1 | 7/2002 | Dordi et al. | |
| 6,436,249 B1 | 8/2002 | Patton et al. | |
| 6,464,571 B1 | 10/2002 | Talieh et al. | |
| 6,468,139 B1 | 10/2002 | Talieh et al. | |
| 6,471,847 B2 | 10/2002 | Talieh et al. | |
| 6,478,936 B1 | 11/2002 | Volodarsky et al. | |
| 6,482,307 B2 | 11/2002 | Ashjaee et al. | |
| 6,497,800 B1 | 12/2002 | Talieh et al. | |
| 6,514,258 B1 | 2/2003 | Brown et al. | |
| 6,527,920 B1 | 3/2003 | Mayer et al. | |
| 6,527,926 B2 | 3/2003 | Woodruff et al. | |
| 6,534,116 B2 | 3/2003 | Basol | |
| 6,589,401 B1 | 7/2003 | Patton et al. | |
| 6,613,214 B2 | 9/2003 | Dordi et al. | |
| 6,749,728 B2* | 6/2004 | Wang | 204/297.09 |
| 6,908,540 B2 | 6/2005 | Kholodenko | |
| 7,138,039 B2* | 11/2006 | Burkhart et al. | 204/286.1 |
| 2003/0010340 A1 | 1/2003 | Verschueren et al. | |
| 2003/0010640 A1 | 1/2003 | Kholodenko | |
| 2004/0074761 A1 | 4/2004 | Herchen et al. | |

FOREIGN PATENT DOCUMENTS

| | | |
|---|---|---|
| EP | 1 010 780 | 6/2000 |
| EP | 1 103 639 | 5/2001 |
| GB | 1 074 607 | 11/1966 |
| JP | 58182823 | 10/1983 |
| JP | 61007291 | 1/1986 |
| JP | 63118093 | 5/1988 |
| JP | 6-17291 | 1/1994 |
| WO | WO 97/12079 | 4/1997 |
| WO | WO 99/54920 | 4/1999 |
| WO | WO 99/25902 | 5/1999 |
| WO | WO 99/25903 | 5/1999 |
| WO | WO 99/25904 | 5/1999 |
| WO | WO 99/25905 | 5/1999 |
| WO | WO 99/26275 | 5/1999 |
| WO | WO 00/03072 | 1/2000 |

OTHER PUBLICATIONS

International Search Report dated Oct. 16, 2002, for PCT/US 02/22489.

International Written Opinion dated May 29, 2003, for PCT/US 02/22489.

Colombo; "Wafer Back Surface Film Removal," Central R&D, SGS-Thomson Microelectronics, Agate Italy.

Herchen; U.S. Appl. No. 10/278,527; "Plating Uniformity Control By Contact Ring Shaping,".

Herchen; U.S. Appl. No. 10/355,479; "Contact Ring With Embedded Flexible Contacts.".

Kholodenko; U.S. Appl. No. 09/905,513, "Method and Apparatus for Encapsulation of an Edge of a Substrate During an Electro-Chemical Deposition Process,".

Keigler, et al.; U.S. Appl. No. 10/274,722, "Method and Apparatus for Sealing Electrical Contacts During an Electrochemical Deposition Process,".

Lubomirsky, et al.; U.S. Appl. No. 10/781,040; "Method for Immersing a Substrate.".

Lubomirsky, et al.; U.S. Appl. No. 10/823,840; "Electrical Bias During Water Exit From Electrolyte Bath.".

Pitney, "Ney Contact Manual" Oct. 1974.

Singer, "Copper Has Enormous Benefits When Compared to Aluminum, but its Implementation Requires Some Fundamental Changes in Progress Technologies," Semiconductor International Jun. 1998.

Singer, "Wafer Processing," Semiconductor International Jun. 1998.

Yang, et al; U.S. Appl. No. 10/616,284, "Multi-Chemistry Plating System".

Yang, et al; U.S. Appl. No. 10/854,006, "Electrochemical Processing Cell".

Semitool Product Catalog (on-line) Oct. 27, 1998.

* cited by examiner

ELECTRIC FIELD REDUCING THRUST PLATE

BACKGROUND OF THE INVENTION

1. Field of the Invention

Embodiments of the invention are generally related to an apparatus and method for minimizing deposition on the bevel and backside of a substrate in an electrochemical deposition cell.

2. Description of the Related Art

Metallization of high aspect ratio 90 nm and smaller sized features is a foundational technology for future generations of integrated circuit manufacturing processes. Metallization of these features is generally accomplished via an electrochemical plating process. However, electrochemical metallization of these features presents several challenges to conventional plating methods and apparatuses. For example, one challenge associated with conventional plating apparatuses and methods is deposition on the bevel or backside of the substrate. Although deposition on the bevel or backside of the substrate generally does not have a negative impact on the production surface of the substrate, the bevel or backside deposition must be removed, requiring additional process steps that reduce substrate throughput.

Deposition on the bevel or backside of the substrate generally results from the electrical field that is used to drive the plating process having an electrical path to the bevel or backside of the substrate. Generally, this path extends around the top of the substrate supporting contact ring and toward the bevel or backside of the substrate in the direction of the electrical contact pins. Conventional plating cells have attempted to reduce this current path by utilizing a front side flange or front side seals configured to minimize edge and bevel deposition. However, these systems have not been successful in preventing bevel or backside deposition, as these frontside devices are not able to minimize the current path that extends around, i.e., over the back, of the substrate supporting contact ring.

Another challenge for conventional plating systems is bubble formation. For example, when a substrate is immersed into a plating solution, bubbles both adhere to the substrate surface and get trapped along the surface the substrate. These bubbles have been shown to subsequently cause plating defects that may render devices formed on the substrate inoperable.

Therefore, there is a need for an electrochemical plating cell and method for plating configured to minimize the electrical field path to the bevel and backside of the substrate. There is also a need for an electrochemical plating cell and method for plating configured to minimize the damage that can be caused by the presence of bubbles across the surface of the substrate.

SUMMARY OF THE INVENTION

The present invention generally provides a contact ring assembly for supporting a substrate in an electrochemical plating system comprising an annular contact ring having a plurality of substrate supporting electrical contact pins extending therefrom to provide electrical current to the surface of the substrate; a thrust plate movably positioned to engage a substrate positioned on the contact pins; and a first barrier member positioned to contact an outer perimeter of the thrust plate and an inner surface of the contact ring to greatly reduce fluid flow therebetween, wherein the first barrier member comprises at least one bubble release channel.

The present invention also generally provides a method for plating a substrate in an electrochemical plating system including positioning a field barrier between a substrate engaging member and a substrate supporting member, the field barrier having at least one bubble release channel.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

The present invention provides an electrolytic cell for semiconductor processing that includes an apparatus configured to minimize the electrical field proximate the bevel or backside of the substrate. Additionally, the invention provides a mechanism for the release of gas bubbles that may collect along the perimeter of the substrate and the contact ring.

Figure 1:
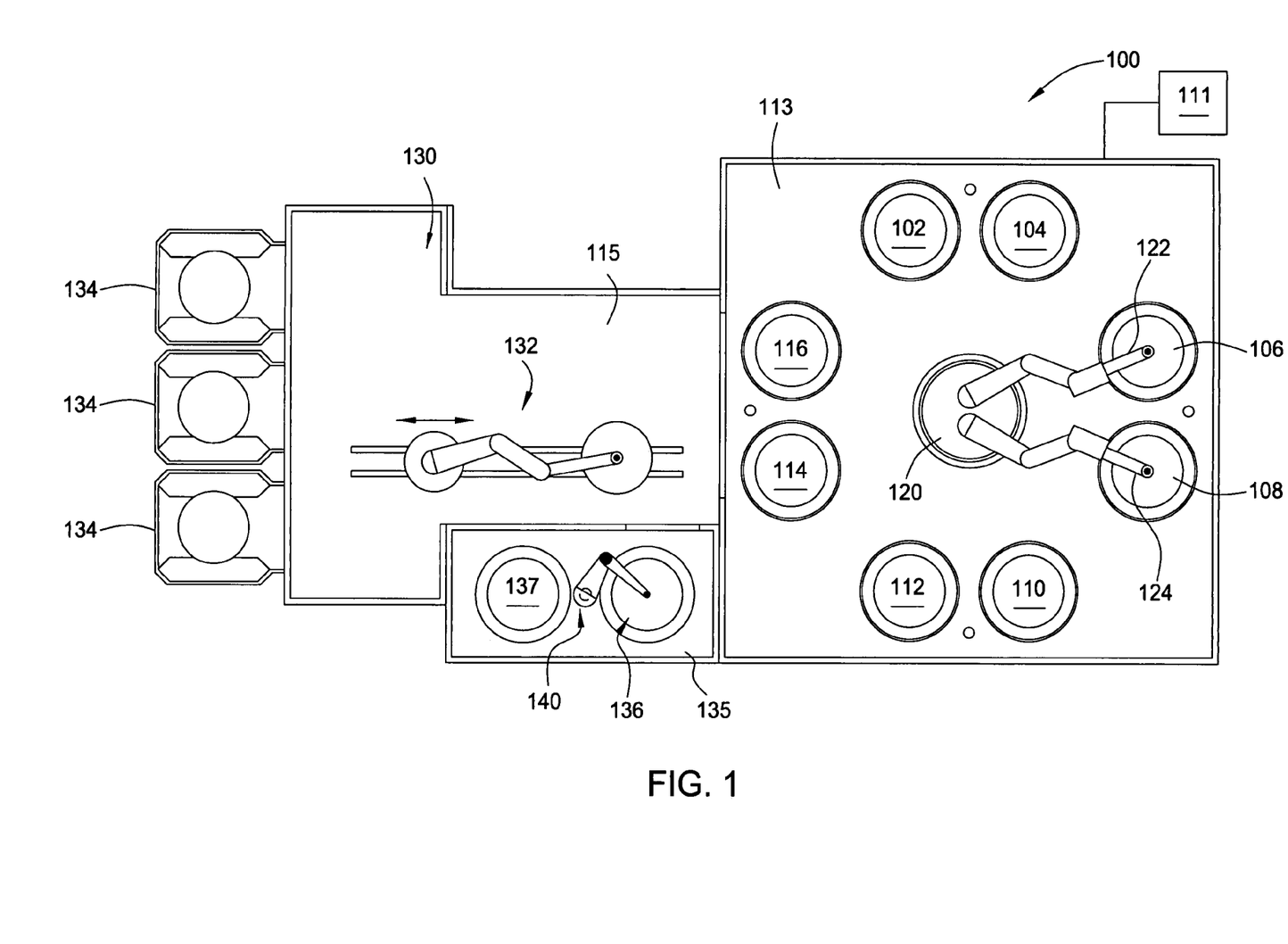
FIG. 1 is a top plan view of one embodiment of an electrochemical plating system of the invention.

FIG. 1 is a top plan view of an exemplary electrochemical plating (ECP) system 100 that may be used to implement embodiments of the invention. ECP system 100 includes a factory interface 130, which is also generally described as a substrate loading location. Factory interface 130 includes a plurality of substrate loading locations configured to interface with substrate containing cassettes 134. A robot 132 is positioned in factory interface 130 and may access substrates (not shown) contained in the cassettes 134. Robot 132 also extends into a link tunnel 115 that connects factory interface 130 to processing mainframe 113. The position of robot 132 allows the robot to access cassettes 134 to retrieve substrates and then deliver the substrates to one of the processing locations 114, 116 positioned on the processing mainframe 113, or to the annealing location 135. Similarly, robot 132 may be used to retrieve substrates from the processing locations 114, 116 or the annealing location 135 after a substrate processing sequence is complete. In this situation robot 132 may deliver the substrate back to one of the cassettes 134 for removal from ECP system 100.

The anneal location 135 generally includes a two position annealing chamber wherein a cooling plate 136 and a heating plate 137 are positioned adjacently with a substrate transfer robot 140 positioned between the two locations. The substrate transfer robot 140 is generally configured to move substrates between the respective heating plate 137 and cooling plate 136.

Processing mainframe 113 has a substrate transfer robot 120 centrally positioned thereon. Substrate transfer robot 120 generally includes one or more arms or blades 122, 124 configured to support and transfer substrates thereon. Additionally, the substrate transfer robot 120 and the accompanying arms or blades 122, 124 are generally configured to extend, rotate, and vertically move so that the substrate transfer robot 120 may insert and remove substrates to and from a plurality of processing locations 102, 104, 106, 108, 110, 112, 114, 116. Generally, process locations 102, 104, 106, 108, 110, 112, 114, 116 may be any number of processing cells utilized in an electrochemical plating platform. More particularly, the process locations may be configured as electrochemical plating cells, rinsing cells, bevel clean cells, spin rinse dry cells, substrate surface cleaning cells (which collectively includes cleaning, rinsing, and etching cells), electroless plating cells, meteorology inspection locations, or other processing cells that may be beneficially used in conjunction with a plating platform. Each of the respective processing locations and robots are generally in communication with a process controller 111, which may be a microprocessor-based control system configured to receive inputs from both a user or various sensors positioned on the ECP system 100 and appropriately control the operation of ECP system 100 in accordance with the inputs. Additional details about ECP systems may be found in U.S. Pat. No. 6,261,433 filed on Jul. 17, 2001 and titled "Electrochemical Deposition System and Method of Electroplating on Substrates," which is incorporated by reference.

Figure 2:
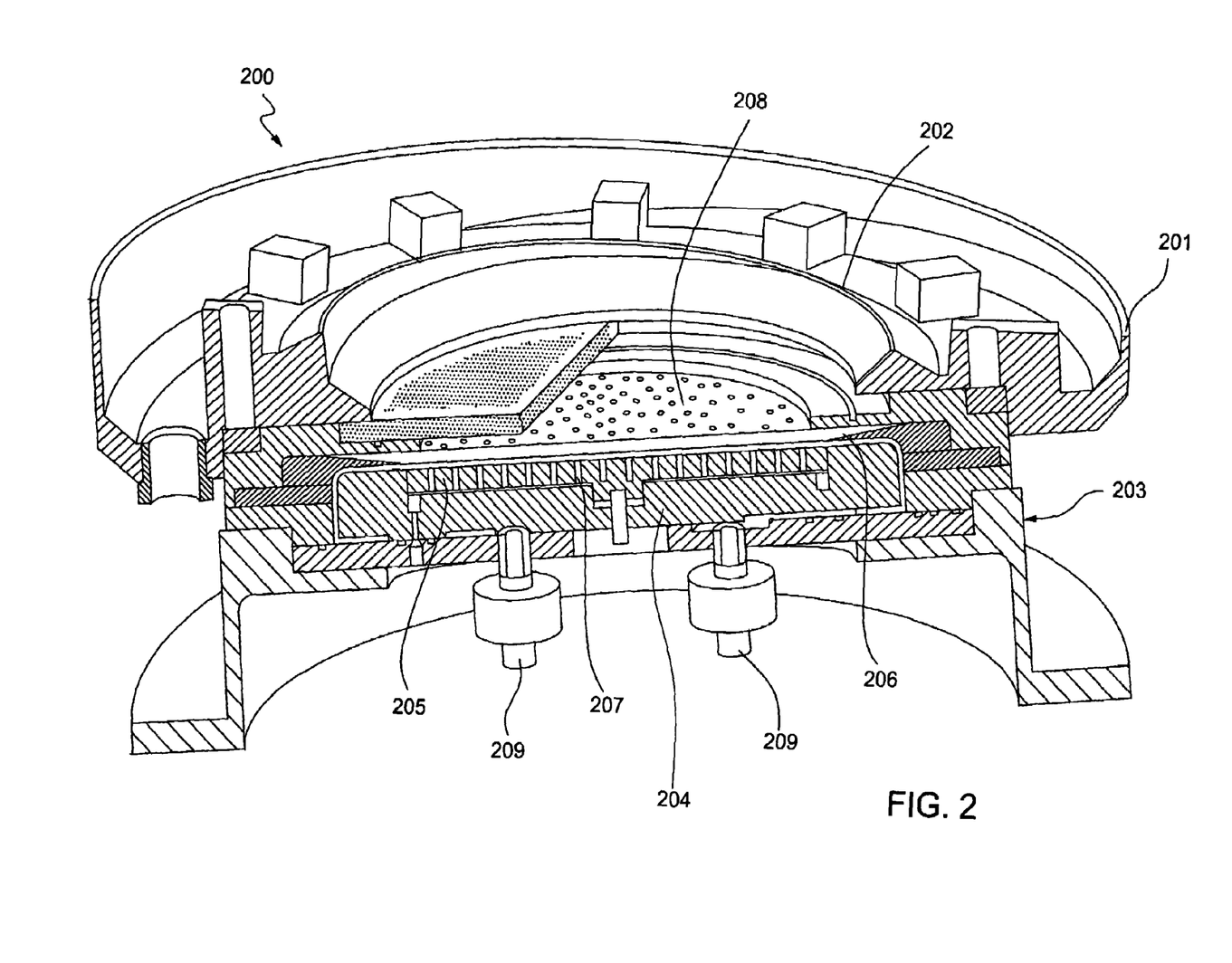
FIG. 2 is a partial perspective and sectional view of an exemplary plating cell of the invention.

FIG. 2 illustrates a perspective and partial sectional view of an exemplary electrochemical plating cell 200 of the invention. The plating cell 200 includes a frame member 203 having an annular base member 204 secured thereto. Base member 204 includes an annular or disk shaped recess formed therein, the annular recess being configured to receive a disk shaped anode 205. Base member 204 further includes a plurality of fluid inlets/drains 209 positioned on a lower surface thereof. Each of the fluid inlets/drains 209 is generally configured to individually supply or drain a fluid to or from an anode compartment or a cathode compartment of plating cell 200. Anode 205 generally includes a plurality of slots 207 formed therethrough, wherein the slots 207 are generally positioned in parallel orientation with each other across the surface of the anode 205. Plating cell 200 further includes a membrane support assembly 206 secured at an outer periphery of base member 204, having an interior region 208 configured to allow fluids to pass through via a sequence of oppositely positioned slots and/or bores. The membrane support assembly 206 may include an o-ring type seal (not shown) positioned near a perimeter of the membrane support assembly 206, wherein the seal is secured on a lower surface of the membrane support assembly 206 and is configured to prevent fluids from traveling from one side of a membrane (not shown) to the other side of the membrane (not shown).

Plating cell 200 also generally includes an outer basin 201 and an inner basin 202 positioned within outer basin 201. Inner basin 202 is generally configured to contain a plating solution that is used to plate a metal, e.g., copper, onto a substrate during an electrochemical plating process. During the plating process, the plating solution is generally continuously supplied to inner basin 202, and therefore the plating solution continually overflows the uppermost point of inner basin 202 and runs into outer basin 201. The overflow plating solution is then collected by outer basin 201 and drained therefrom for recirculation into inner basin 202. Plating cell 200 is generally positioned at a tilt angle, as the frame member 203 is generally elevated on one side to allow the components of plating cell 200 to tilt between about 3° and about 30°. Therefore, in order to contain an adequate depth of plating solution within inner basin 202 during plating operations, the uppermost portion of inner basin 202 may be extended upward on one side of plating cell 200, such that the uppermost point of inner basin 202 is generally horizontal and allows for contiguous overflow of the plating solution supplied thereto around the perimeter of inner basin 202. Additional details of plating cell 200 may be found in U.S. patent application Ser. No. 10/268,284 filed on Oct. 9, 2002 and titled "Electrochemical Processing Cell," which is incorporated by reference.

Figure 3A:
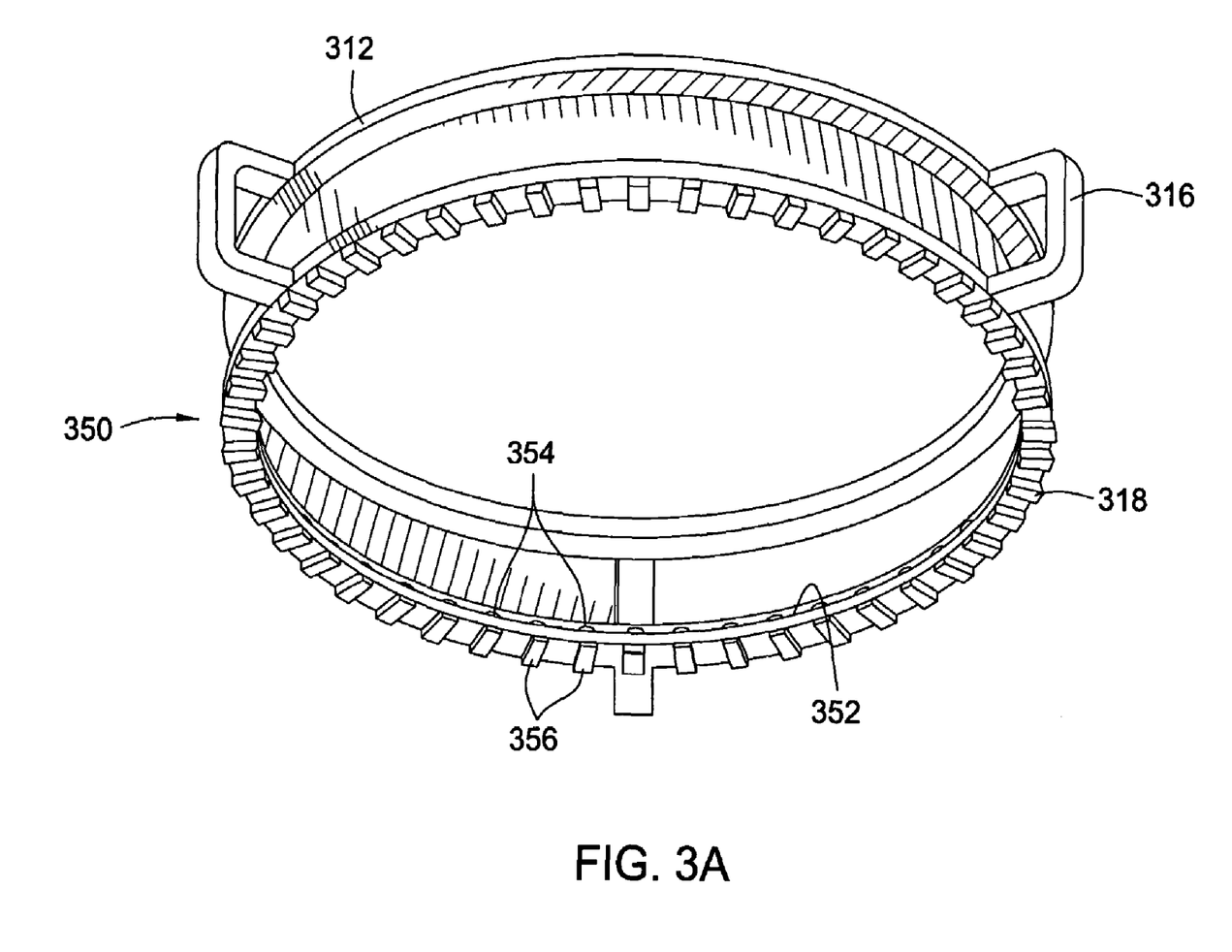
FIG. 3A is a perspective view of a contact ring.

FIG. 3A is a perspective view of a substrate contact ring 350. Contact ring 350 includes upper ring portion 312, support arm 316, and lower ring portion 318. Lower ring portion 318 includes upwardly extending electrical contact pins 354. The electrical contact pins 354 may be formed above scallops 356 in a generally circular pattern around a substrate seating surface 352 of the contact ring 350. The electrical contact pins 354 may vary in number according to the size of the substrate (not shown). The electrical contact pins 354 may also be flexible to contact plating surfaces with non-uniform heights. Power may be supplied to the electrical contact pins 354 via a power supply (not shown). The power supply may supply electrical power to all of the electrical contact pins 354 cooperatively, banks or groups of the electrical contact pins 354 separately, or to the individual electrical contact pins 354. In embodiments where current is supplied to groups or individual electrical contact pins 354, a current control system may be employed to control the current applied to each group or pin.

For some embodiments, the contact ring 350, support arms 316, and upper ring portion 312 may all be made of an electrically conductive material. The conductive material may be coated in an insulating material, such as tetrafluoroethylene-perfluoro (alkyl vinyl ether) copolymer (PFA), polyvinylidene difluoride (PVDF), polytetrafluoro ethylene (PTFE), ethylene/chlorotrifluoro ethylene (ECTFE), and ethylene/tetrafluoro ethylene (ETFE). As with the electrical contact pins 354, the contact ring 350, support arms 316, and upper ring portion 312 may be made of any suitable electrically conductive material and, for some embodiments, may be made of stainless steel. Accordingly, the support arms 316 may electrically couple the upper ring portion 312 and the contact ring 350. Therefore, power may be supplied to the electrical contact pins 354 by one or more electrical connections between the upper ring portion 312 and a power supply. Additional details of the contact ring assembly may be found in U.S. application Ser. No. 10/278,527 filed on Oct. 22, 2002 and titled, "Plating Uniformity Control by Contact Ring Shaping," which is incorporated by reference. Additional details of the contact ring assembly may also be found in U.S. Pat. No. 6,251,236, filed on Nov. 30, 1998 and titled "Cathode Contact Ring for Electrochemical Deposition," which is incorporated by reference. Finally, additional details of the contact ring assembly may also be found in U.S. Pat. No. 6,613,214, filed on Dec. 5, 2000 and titled, "Electric Contact Element for Electrochemical Deposition System and Method," which is incorporated by reference.

Figure 3B:
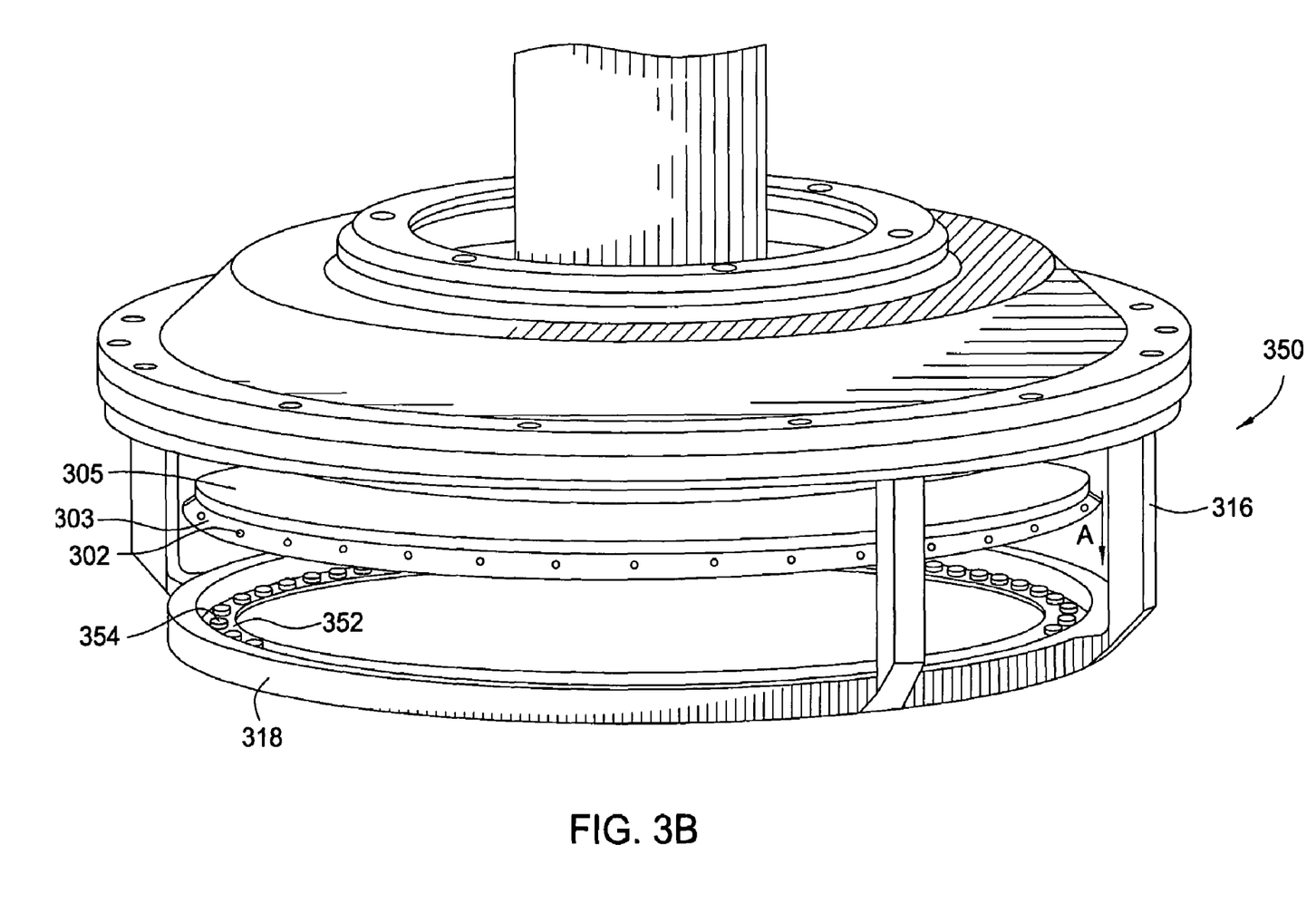
FIG. 3B is a perspective view of a thrust plate and contact ring assembly of the invention in an unclamped position.

FIG. 3B is a perspective view of a thrust plate 305 and contact ring 350 in a processing position. The thrust plate 305 is configured to engage the substrate (not shown in FIG. 3B) and the electrical contact pins 354 in a processing position by providing motion in the arrow A direction and to remove the substrate from the electrical contact pins 354 by providing motion in the opposite direction. The contact ring 350 provides electrical charge to the substrate via electrical contact pins 354. A lip seal 303 is attached to a perimeter portion of the thrust plate 305 such that the lip seal 303 is positioned between the outer perimeter of the thrust plate 305 and the inner circumference of the contact ring 350 when the thrust plate 305 and contact ring 350 are in the processing position.

The lip seal 303 is annular and makes continuous contact with contact ring 350 when the thrust plate 305 is in the processing position. The lip seal 303 contains bubble release channels 302 formed therethrough that may preferably be spaced evenly between and above the electrical contact pins 354. The lip seal 303 is preferably manufactured from elastomeric polymers or other relatively flexible and generally electrically resistive material. The material may also be able to withstand the harsh processing conditions and chemicals that are used in electrochemical plating systems. The concentration of chemicals may be even higher than the concentration of chemicals in the electroplating cell because the solution near the seal may evaporate upon exposure to the controlled gaseous atmosphere. The lip seal 303 may contain fluorine to withstand harsh conditions and to reduce seal sticking when the thrust plate releases the substrate. The lip seal 303 components may be made out of two independent materials and the two materials may also be selected for their bonding ability. The lip seal 303 supporting portion may be solid polyetherimide (such as ULTEM), polyphenylene sulphide (PPS), polyvinyl difluoride (PVDF), or polyether ether ketone (such as PEEK). The lip seal 303 flexible, extending position may be made of fluoroelastomer (such as FKM, known commercially as Viton™), perfluoroelastomer (such as FFKM), high density polyethylene, tetrafluoroethylene-perfluoro (alkyl vinyl ether) copolymer (such as PFA), polytetrafluoro ethylene (PTFE), or ethylene propylene diene (EPDM).

A more detailed description of the contact ring 350 may be found in commonly assigned U.S. patent application Ser. No. 10/278,527, which was filed on Oct. 22, 2002 under the title "Plating Uniformity Control By Contact Ring Shaping", which is hereby incorporated by reference in its entirety. Also, additional configurations and implementations of an electrochemical processing system are in commonly assigned United Sates patent application Ser. No. 10/435,121 filed on Dec. 19, 2002 entitled "Multi-Chemistry Electrochemical Processing System," which is incorporated herein by reference in its entirety.

Figure 4:
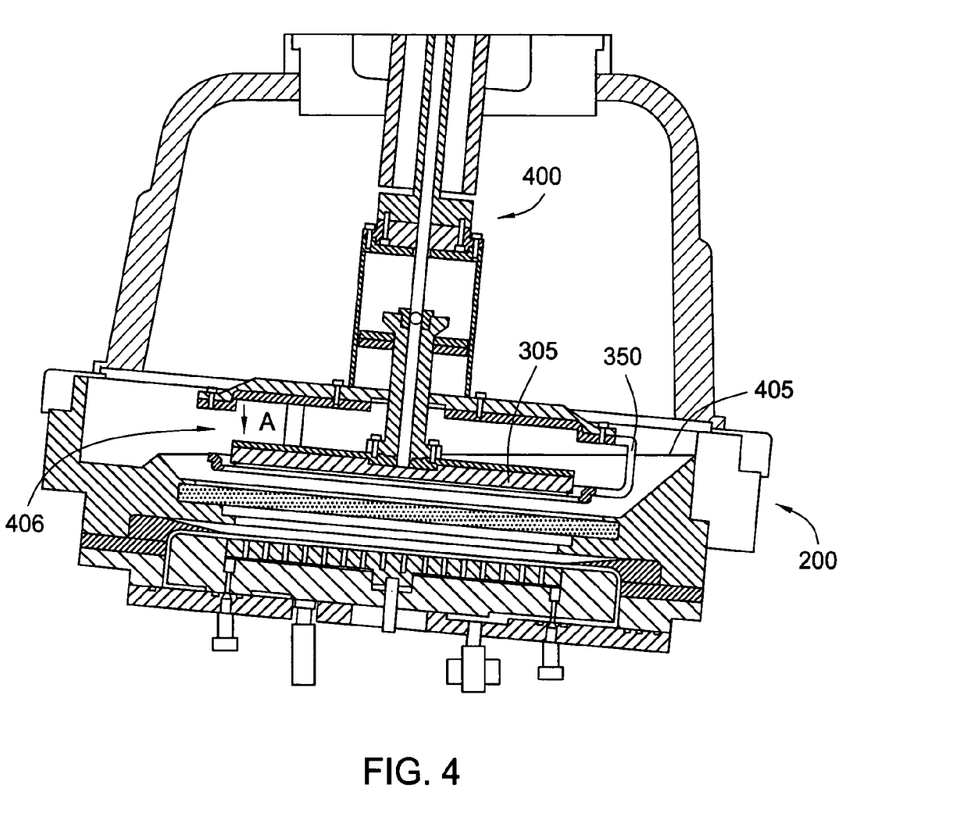
FIG. 4 is a sectional view of an exemplary plating cell and head assembly of the invention.

FIG. 4 is a sectional view of an exemplary electrochemical plating cell 200 and head assembly 400 that is similar to the embodiment of FIG. 3B. The lower portion of the head assembly 400 includes a thrust plate 305 and contact ring 350. The contact ring 350 has an access space 406 configured to provide egress for a substrate (not shown) when the thrust plate 305 is in a loading position. The thrust plate moves in the direction indicated by the arrow A to engage the substrate with the electrical contact pins 354. The head assembly 400 is configured to introduce the substrate (not shown) into the electroplating solution contained in the plating cell 200. The plating cell 200 contains an inner weir 405.

Figure 5A:
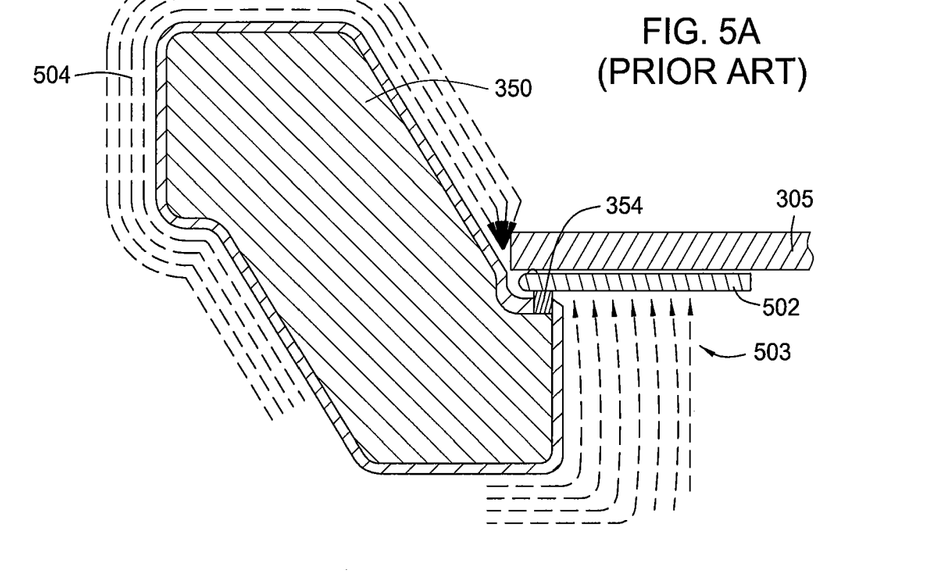
FIG. 5A is a sectional view of a prior art contact ring.
Figure 5B:
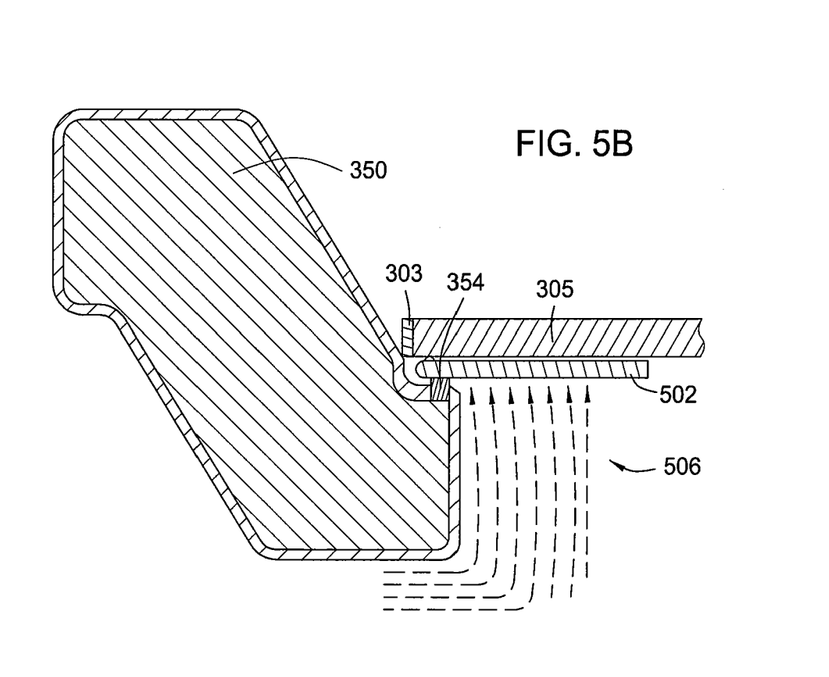
FIG. 5B is a sectional view of an embodiment of a contact ring and lip seal of the invention.

To illustrate how an electrical field may be modified by the presence of an embodiment of lip seal 303 of FIG. 3B, FIGS. 5A and 5B provide a sectional view of a contact ring 350. FIG. 5A is a sectional view of a conventional configuration including a substrate support contact ring 350, contact 354, and substrate 502. The electrical field flow is approximated by flow lines 503 and 504, wherein flow lines 503 represent the front side electrical field and flow lines 504 represent the backside electrical field. In contrast, FIG. 5B is a sectional view of a substrate support contact ring 350, contact 354, substrate 502, and lip seal 303 of the invention. The front side electrical field flow is approximated by flow lines 506, and the backside field lines have been substantially eliminated by the presence of lip seal 303.

Figure 6A:
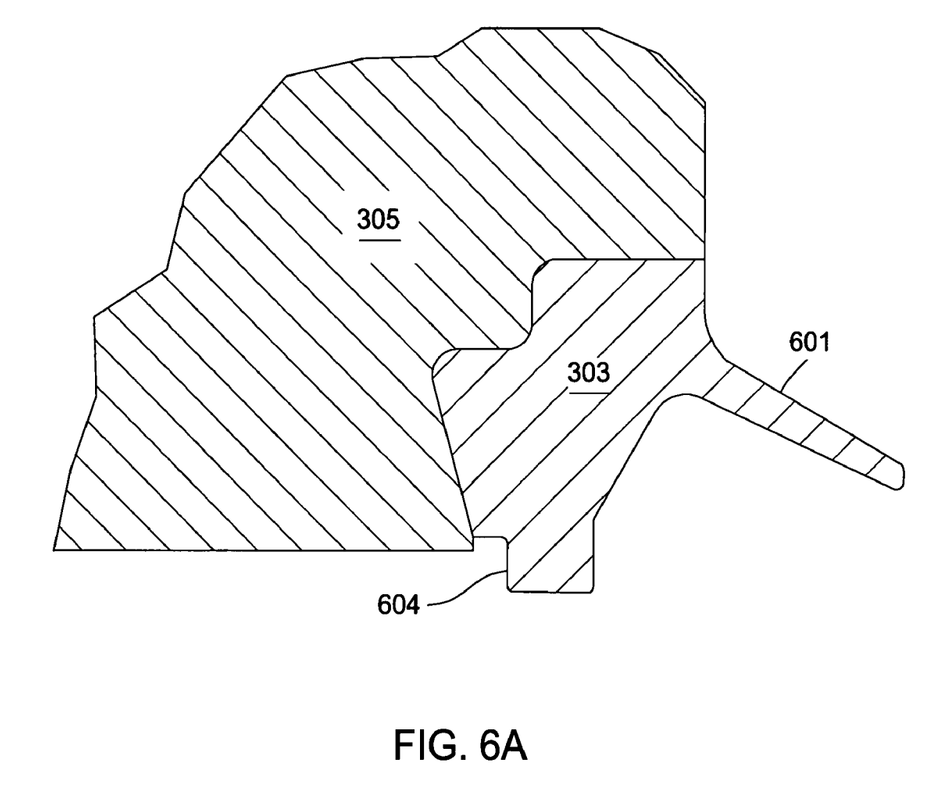
FIG. 6A is a sectional view of an embodiment of a lip seal of the invention.
Figure 6B:
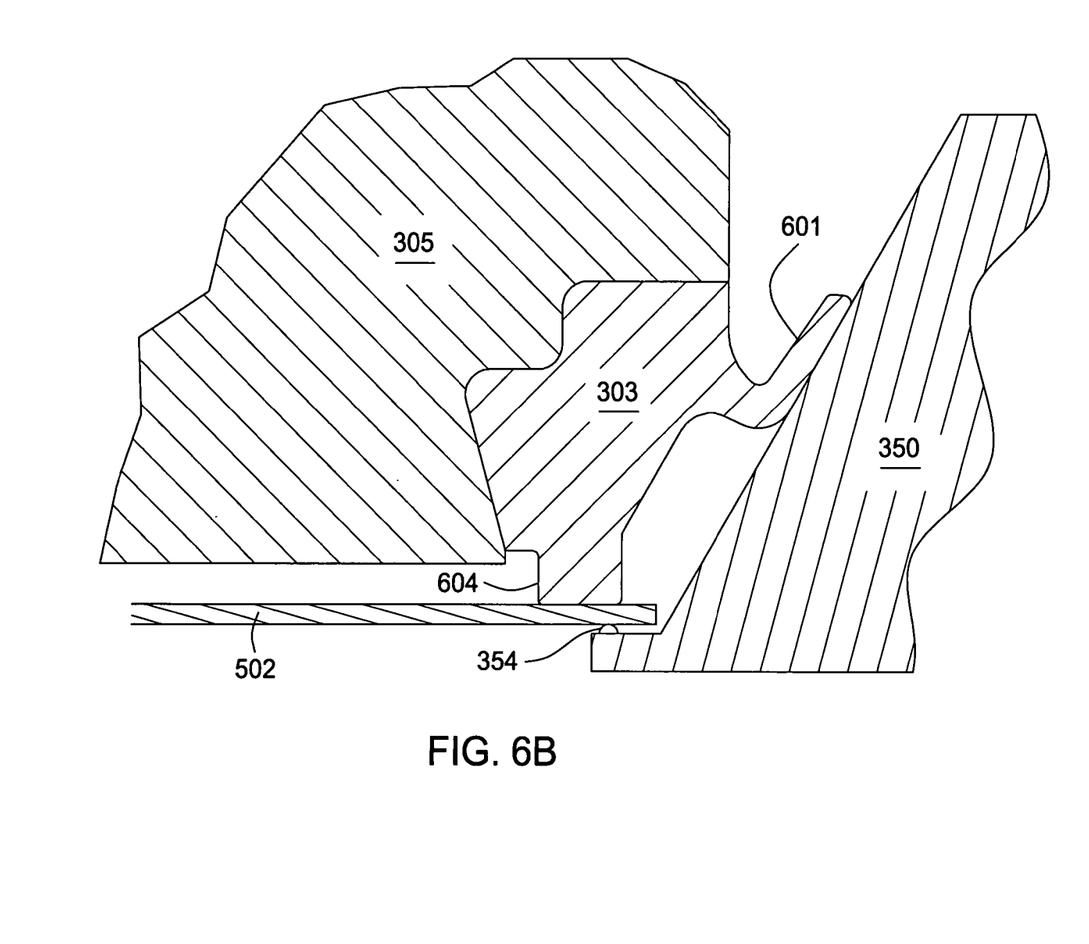
FIG. 6B is a sectional view of an embodiment of a lip seal of the invention in an engaged position.
Figure 7:
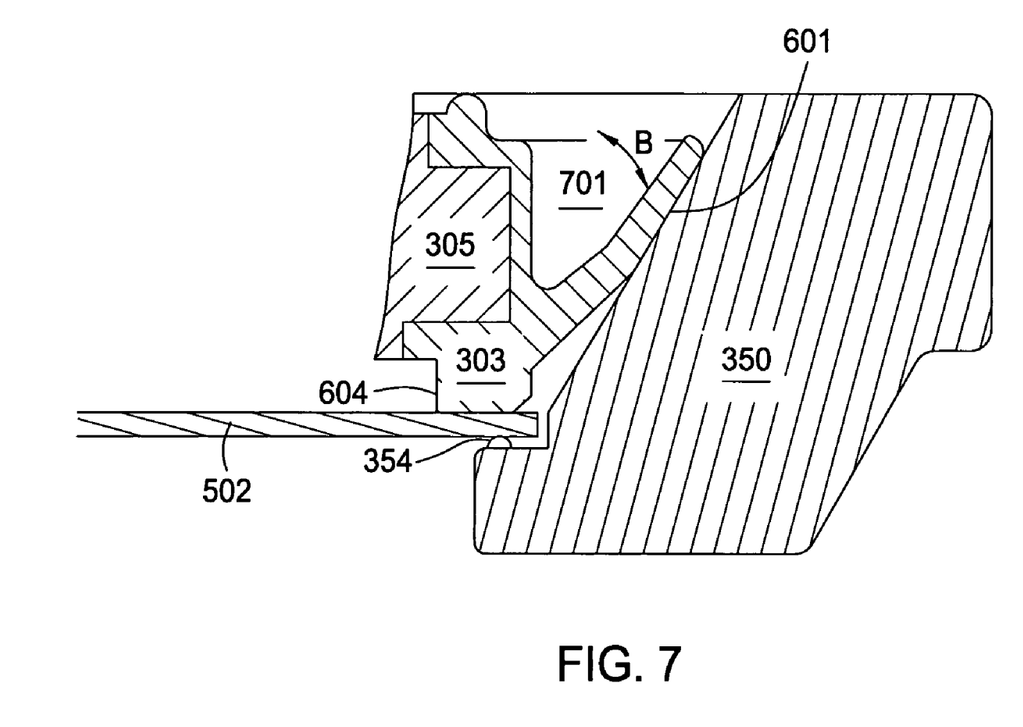
FIG. 7 is a sectional view of an alternative embodiment of a lip seal of the invention.
Figure 8:
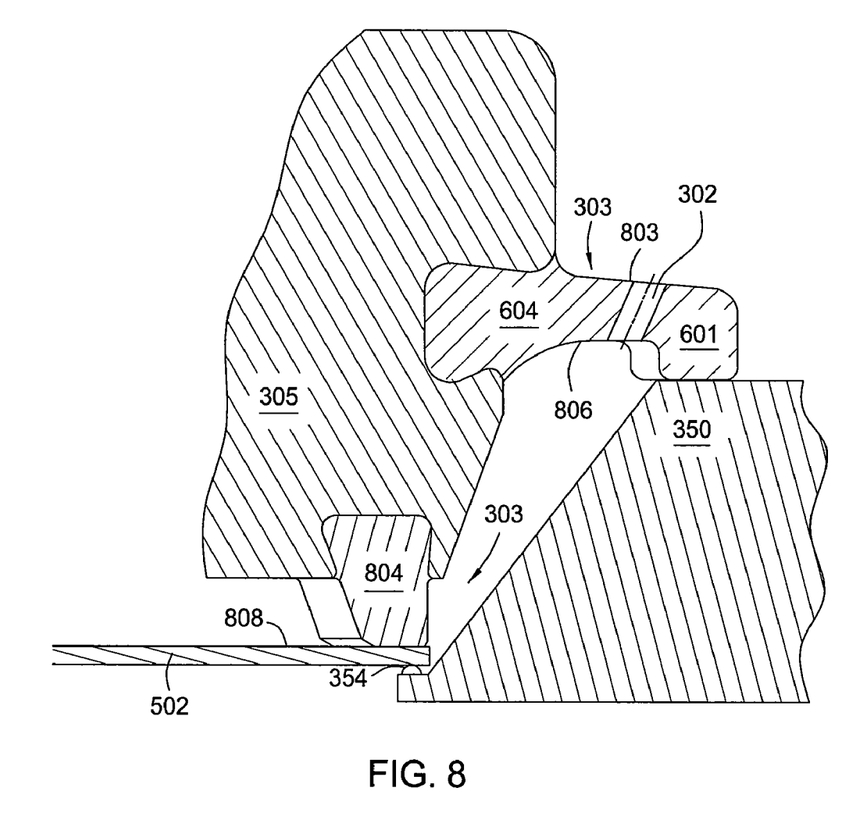
FIG. 8 is a sectional view of an additional alternative embodiment of a lip seal of the invention.

Embodiments of lip seal 303 are illustrated by FIGS. 6-8. FIGS. 6A and 6B are sectional views of a lip seal 303 that provides a seal between the contact ring 350 and the thrust plate 305 with a base 604 and a flexible lip 601. The flexible lip 601 forms an inverse Y shape when not engaged as shown in FIG. 6A. FIG. 6B illustrates when the thrust plate 305 engages the substrate 502 with electrical contact pins 354, the flexible lip 601 of the lip seal 303 conforms to the surface of the contact ring 350 and the upper contact area with thrust plate 305. In an alternative preferred embodiment, the lip seal 303 of FIG. 6A may also have a flexible lip 601 configured to engage the top of contact ring much like the embodiment illustrated by FIG. 8.

FIG. 7 is a sectional view of a lip seal 303 positioned between the contact ring 350 and the thrust plate 305 with a base 604 and flexible lip 601 that forms a V shape 701 between the contact ring 350 and the thrust plate 305. The flexible lip 601 conforms to the surface of the contact ring 350 when the thrust plate 305 engages the substrate 502 with the electrical contact pins 354. The flexible lip 601 may bend in the direction B as indicated by arrow B.

FIG. 8 is a sectional view of an additional embodiment of a lip seal 303 with a base 604 and a flexible lip 601 that forms a C shape 806 as seal component 803 bridges the space between the contact ring 350 and the thrust plate 305 when the thrust plate 305 engages the substrate 502 with the electrical contact pins 354. The lip seal 303 also includes an additional seal component 804 between the substrate surface 808 and the thrust plate 305. A bubble release channel 302 is located in the middle of flexible lip 601. The bubble release channel 302 and contact 354 are both illustrated by this cross section. However, along the circumference of the substrate 502, the bubble release channel 302 is evenly spaced between two adjacent electrical contact pins 354.

In operation, a substrate may be supported in a face down (production surface facing down) orientation with a vacuum engaging device attached to the robot arm or blade 122, 124, wherein the vacuum engaging device is configured to engage the backside or non-production surface of the substrate. The substrate transfer robot 120 may then extend into contact ring 350 via access space 406, lower to position the substrate on the electrical contact pins 354 and substrate support surface of contact ring 350, disengage the vacuum engaging device, raise to a withdrawal height, and then withdraw from the contact ring 350.

After the substrate is positioned on the contact ring 350, thrust plate 305 may be lowered into a processing position indicated by arrow A (in FIG. 4). Once the substrate is secured to the contact ring 350 by the thrust plate 305, the lower portion of the head assembly 400 may be pivoted to a tilt angle for an immersion and/or plating process. The plating solution is generally contained within the inner weir 405 of the plating cell 200 and overflows the uppermost point of the inner weir 405.

Gas entrapment across the surface of the substrate can occur in plating cells. Gas entrapment is problematic because it results in uneven copper deposition across the surface of the substrate. Bubbles adhering to the substrate surface during the process of immersing the substrate into the plating solution contained in a plating cell should be minimized. Thus, as head assembly 400 is moved toward plating cell 200, the side of contact ring 350 positioned closest to plating cell 200 as a result of the tilt angle first contacts the plating solution as the head assembly 400 is actuated toward cell 405. The process of actuating head assembly 400 toward cell 405 may further include imparting rotational movement to contact ring 350. Hence, during the initial stages of the immersion process, contact ring 350 is generally being actuated in a vertical or Z-direction while also being rotated about a vertical axis extending upward through head assembly 400. Generally, the vertical axis about which contact ring 350 is rotated is orthogonal to the substrate surface. Additional details about the immersion process may be found in commonly assigned U.S. patent application Ser. No. 60/448,575, filed Feb. 18, 2003 and titled "Wafer Immersion Mechanism," which is incorporated herein by reference in its entirety.

FIG. 8 illustrates a lip seal 303 that blocks fluid flow between the substrate 502 and the contact ring 350. Gas entrapment is potentially troublesome because gas generally will not be able to egress through some lip seal configurations. However, the lip seal 303, as illustrated in FIG. 8, has a bubble release channel 302 to reduce gas entrapment across the surface and especially the perimeter of the front side of the substrate 502. The bubble release channels 302 are selected to be radially spaced evenly between the electrical contact pins 354. Although not specifically illustrated, the other embodiments may also include bubble release channels. Also, although it is not specifically illustrated, the bubble release channels may be located on the base 604 or flexible lip 601. Finally, testing indicates a continuous gap between the contact ring and thrust plate may be undesirable because the continuous gap may facilitate copper deposition.

FIGS. 5A and 5B compare how the electrical field may be controlled by utilizing a lip seal 303. As the electrical field flows through the electrolyte solution, the copper ions in solution are attracted to the cathodic charge provided by the contact ring 350. When a lip seal 303 is not used, the electrical field flow is free to travel around the contact ring 350, and this causes deposition along the backside and bevel of the substrate 502, as illustrated by FIG. 5A. When the electrical field flows over the upper surface of the contact ring 350, the copper ions in the electrolyte solution surrounding the immersed contact ring 350, electrical contact pins 354, and backside and bevel surfaces of the substrate 502 are attracted to the charged surfaces and, thus, deposit along the electrical contact pins 354 and the backside and/or bevel of the substrate 502.

The lip seal 303 of the invention forms a field barrier, i.e., electric field barrier, between the thrust plate 305 and the backside and/or bevel of the substrate 502 or electrical contact pins 354. Although configured to allow electrolyte solution to occupy the region between the thrust plate 305 and backside and/or bevel of the substrate 502, the lip seal 303 is configured to minimize or prevent the electric field from passing therethrough. As such, backside electric field flow 504 as illustrated by FIG. 5A is reduced. As the electrical field flow is reduced, the copper deposition is also reduced. The reduction in variation across the surface of the substrate decreased from about 750 Å for a conventional system to about 500 Å for the lip seal system.

As a result of the bubble release channels 302 in the lip seal 303, the lip seal 303 may not completely block the electrical field flow. The travel path for the electrical field to flow to the bevel or backside of the substrate 502 is significantly lengthened because the bubble release channels 302 are positioned halfway between the electrical contact pins 354. This positioning creates a relatively long distance electrical field path between the electrolyte solution and the solution around the bevel and/or backside of the substrate 502 near the contact ring 350.

Generally, by use of the structures of this invention, the efficiency of the system increased 10 substrates an hour from 65 to 75 substrates an hour. The bevel etch time was reduced from 23 seconds to 5 seconds. Decreased staining and similar substrate defects were observed. More uniform copper plating was observed during repeatability tests.

While the foregoing is directed to embodiments of the present invention, other and further embodiments of the invention may be devised without departing from the basic scope thereof, and the scope thereof is determined by the claims that follow.

The invention claimed is:

1. A contact ring assembly for supporting a substrate in an electrochemical processing system, comprising:
    an annular contact ring configured to support and electrically contact a processing surface of the substrate;
    a thrust plate movably positioned to engage a backside of the substrate positioned on the contact ring; and
    a lip seal member extending from an outer perimeter of the thrust plate and contacting an inner surface of the contact ring to prevent fluid flow therebetween, wherein the lip seal member comprises at least one bubble release channel formed therethrough.

2. The contact ring of claim 1, wherein the lip seal member comprises a base member affixed to the thrust plate assembly and a flexible extending seal member.

3. The contact ring of claim 1, wherein the at least one bubble release channels are evenly spaced between a plurality of electrical contact pins extending from the contact ring.

4. The contact ring of claim 1, wherein the lip seal member comprises an elastomer selected from the group consisting of fluoroelastomer (FKM), perfluoroelastomer (FFKM), tetrafluoroethylene-perfluoro (alkyl vinyl ether) copolymer (PFA), polytetrafluoro ethylene (PTFE), polyvinylidene difluoride (PVDF), and combinations thereof.

5. The contact ring of claim 1, further comprising a backside substrate seal positioned between a backside of the substrate and the thrust plate.

6. The contact ring of claim 2, wherein the flexible extending seal member is positioned to engage a substantially horizontal surface of the contact ring.

7. The contact ring of claim 2, wherein the flexible extending seal member is configured to substantially prevent electric field from traveling therethrough while allowing gas bubbles to pass therethrough.

8. A contact ring assembly for supporting a substrate in an electrochemical processing system, comprising:
    an annular contact ring having a plurality of substrate supporting electrical contact pins extending therefrom;
    a thrust plate assembly movably positioned to engage a substrate positioned on the contact pins;

an electric field barrier positioned between an outer perimeter of the thrust plate and a surface of the contact ring; and at least one bubble release channel formed into the electric field barrier.

9. The contact ring assembly of claim 8, wherein the at least one bubble release channel is positioned above the electrical contact pins and equally spaced therefrom.

10. The contact ring assembly of claim 8, wherein the electric field barrier comprises a seal member longitudinally extending from a base that is attached to a perimeter of the thrust plate.

11. The contact ring assembly of claim 10, wherein the longitudinally extending sealing member is vertically flexible.

12. The contact ring assembly of claim 8, wherein the electric field barrier comprises an elastomer selected from the group comprising fluoroelastomer (FKM), perfluoroelastomer (FFKM), tetrafluoroethylene-perfluoro (alkyl vinyl ether) copolymer (PFA), polytetrafluoro ethylene (PTFE), polyvinylidene difluoride (PVDF), and combinations thereof.

13. The contact ring assembly of claim 11, wherein the seal member of the electric filed barrier is positioned to contact a substantially horizontal surface of the contact ring.

14. The contact ring assembly of claim 11, wherein the seal member of the electric filed barrier is positioned to contact a sloped surface of the contact ring.

15. A method for processing a substrate in an electrochemical processing system, comprising positioning an electric field barrier between a backside substrate engaging member and a frontside substrate supporting member, the field barrier having at least one bubble release channel formed therethrough.

16. The method of claim 15, wherein the at least one bubble release channel is positioned above electrical contact pins extending from the substrate supporting member and equally spaced therebetween.

17. The method of claim 15, wherein the electric field barrier comprises a base attached to the thrust plate and a longitudinally extending sealing member.

18. The method of claim 15, wherein the electric field barrier is manufactured from a material configured to substantially prevent electric field from passing therethrough.

19. The method of claim 18, wherein the electric field barrier comprises an elastomer selected from the group consisting of fluoroelastomer (FKM), perfluoroelastomer (FFKM), tetrafluoroethylene-perfluoro (alkyl vinyl ether) copolymer (PFA), polytetrafluoro ethylene (PTFE), polyvinylidene difluoride (PVDF), and combinations thereof.

20. The method of claim 19, wherein the electric field barrier is configured to minimize an electric field path to the backside and bevel of the substrate.

* * * * *